United States Patent [19]
Chang et al.

[11] Patent Number: 5,801,994
[45] Date of Patent: Sep. 1, 1998

[54] NON-VOLATILE MEMORY ARRAY ARCHITECTURE

[75] Inventors: Shang-De Ted Chang, Fremont; Chinh D. Nguyen; Guy S. Yuen, both of San Jose, all of Calif.

[73] Assignee: Programmable Microelectronics Corporation, San Jose, Calif.

[21] Appl. No.: 911,968

[22] Filed: Aug. 15, 1997

[51] Int. Cl.$^6$ ............................................. G11C 16/04
[52] U.S. Cl. .............................. 365/185.29; 365/185.12
[58] Field of Search ....................... 365/185.29, 185.33, 365/185.11, 185.12

[56] References Cited

U.S. PATENT DOCUMENTS

| | | | |
|---|---|---|---|
| 5,126,808 | 6/1992 | Montalvo et al. | 365/185 X |
| 5,185,718 | 2/1993 | Rinerson et al. | 365/185.12 |
| 5,289,411 | 2/1994 | Jeng et al. | 365/185.12 |
| 5,365,484 | 11/1994 | Cleveland et al. | 365/218 |
| 5,384,742 | 1/1995 | Miyakawa et al. | 365/185.12 |
| 5,422,843 | 6/1995 | Yamada | 365/185.12 |
| 5,636,162 | 6/1997 | Coffman et al. | 365/185.12 |

*Primary Examiner*—Son Mai
*Attorney, Agent, or Firm*—William L. Paradice, III; Flehr Hohbach Test Albritton & Herbert LLP

[57] ABSTRACT

A memory array includes a predetermined number of rows of PMOS Flash memory cells formed in each of a plurality of n– well regions of a semiconductor substrate, where each of the n– well regions defines a page of the memory array. In some embodiments, a plurality of bit lines define columns of the memory array, where the p+ drain of each of the memory cells in a common column are coupled to an associated one of the bit lines. In other embodiments, a plurality of sub-bit lines define columns of the memory array, where the p+ drain of each of the memory cells in a common column are coupled to an associated one of the sub-bit lines, and groups of a predetermined number of the sub-bit lines are selectively coupled to associated ones of a plurality of bit lines via pass transistors. During erasing operations a selected n– well region, within which are formed the memory cells of a selected page, is held at a first voltage, while the other n– well regions, within which are formed the memory cells of the respective un-selected pages, are held at a second voltage. The first and second voltages are different, thereby isolating the un-selected pages from erasing operations of the selected page.

24 Claims, 3 Drawing Sheets

_5,801,994_

NON-VOLATILE MEMORY ARRAY ARCHITECTURE

CROSS REFERENCE TO RELATED APPLICATIONS

This application is related to the U.S. patent application Ser. No. 08/557,589, entitled "A PMOS Memory Cell with Hot Electron Injection Programming and Tunneling Erasing", and filed on Nov. 14, 1995.

BACKGROUND

1. Field of Invention

This invention relates generally to semiconductor memories and specifically to an array architecture for housing non-volatile PMOS floating gate memory cells.

2. Description of Related Art

Flash EEPROM, which combines the advantages of EPROM density and EEPROM erasibility, is becoming increasing popular in the semiconductor memory market. Traditionally, flash EEPROM, as well as EPROM and EEPROM, has been fabricated using NMOS technology due to the superior mobility of electrons over holes. EPROM cells are programmed via electron tunneling and erased using ultraviolet radiation, while EEPROM cells are programmed and erased via electron tunneling.

FIG. 1 illustrates a conventional NMOS flash memory cell 10. A p− substrate 12 has an n+ source 14 and an n+ drain 16 formed therein. A channel 18 extends within substrate 12 between the n+ source 14 and the n+ drain 16. A thin gate dielectric layer 20 separates a polysilicon floating gate 22 from the substrate 12. The gate dielectric 20 may be, for instance, a layer of silicon dioxide ($SiO_2$) having a thickness of approximately 100 Å. A second dielectric layer 24 separates a control gate 26 from the floating gate 22. Although not illustrated in FIG. 1, a protective insulating layer is typically formed over the Flash EEPROM cell 10, and electrical contacts are made to the n+ source 14, the n+ drain 16, and the control gate 26.

To program the cell 10, approximately 5 volts and 12 volts are applied to the drain 16 and control gate 26, respectively, for a few milliseconds, while the source 14 is held at a low potential, e.g., ground potential. In response thereto, electrons accelerate across the channel 18 and, colliding with electrons and lattice atoms proximate the drain 16, generate hot electrons. The hot electrons are attracted to the high positive voltage on the control gate 26 and are injected into the floating gate 22. The resulting accumulation of negative charge within the floating gate 22 increases the threshold voltage of the cell 10, thereby programming the cell 10.

The cell 10 is erased by floating the drain 16, grounding the control gate 26, and applying approximately 12 volts to the source 14. Electrons within the floating gate 22 tunnel through the gate dielectric 20 and into the source 14, thereby restoring the threshold voltage to its original level and, thus, erasing the cell 10.

To read the cell 10, the source 14 is grounded, the drain 16 is held at approximately between 1 and 2 volts, and the control gate 26 is held at approximately 5 volts. Under these bias conditions, the cell 10 will conduct a channel current only if in an erased state.

There are many well known array architectures which incorporate a Flash EEPROM cell such as, for instance, cell 10 (FIG. 1). Some Flash EEPROM array architectures, such as that disclosed in U.S. Pat. No. 5,126,808, issued to Montalvo et al on Jun. 30, 1992, allow an individual page of the memory array to be selectively erased without affecting the remaining un-selected pages of the memory array.

Technological improvements have led to the development of a PMOS Flash EEPROM cell, as disclosed in U.S. patent application Ser. No. 08/557,589, filed Nov. 14, 1995, later issued to Chang on Nov. 11, 1997, as U.S. Pat. No. 5,687,118. FIG. 2 illustrates a PMOS Flash EEPROM cell 30 in accordance with the invention of the Chang patent. Cell 30 is formed in an n− well region 32 of a p− substrate 34. A p+ source 36 and a p+ drain 38 are formed in the n− well region 32. A channel 40 extends within the n− well 32 between the p+ source 36 and the p+ drain 38. A polysilicon floating gate 42 is insulated from the n− well region 32 by a thin tunnel oxide layer 44. Preferably, the oxide layer 44 is approximately between 80–130 Å thick and extends over the entire length of channel 40 and portions of both the p+ source 36 and the p+ drain 38. A control gate 46 is insulated from the floating gate 42 by an insulating layer 48.

To program the cell 30, approximately 6.5 volts is applied to the p+ source 36, the p+ drain 38 is grounded, and the control gate 46 is ramped from approximately ground potential to approximately 4 volts. These bias conditions cause positively charged holes to accelerate across the channel 40 towards the p+ drain 38. These holes collide with electrons and lattice atoms in a drain depletion region 50 proximate the p+ drain 38 and result in impact ionization. High energy electrons generated from the impact ionization are attracted to the ramped voltage on the control gate 46 and are injected into the floating gate 42. The resultant negative charge on the floating gate 42 increases the threshold voltage of the cell 30, thereby programming the cell 30.

To erase the cell 30, approximately 9 volts is applied to the p+ source 36, to the p+ drain 38, and to the n− well 32, while the control gate 46 is held at approximately −9 volts. Electrons within the floating gate 32 tunnel through the gate oxide layer 44 and into the p+ source 32, the p+ drain 38, and the channel 40 of the cell 30, thereby returning the threshold voltage of the cell 30 to its normal level. This erasing technique is known as a channel erase.

The binary state of cell 30 is read by applying a voltage of, for instance, approximately 3 volts to the p+ source 36 and the n− well 32. The control gate is coupled to a potential between ground potential and $V_{cc}$, and the p+ drain 38 is coupled to a voltage slightly less than $V_{cc}$. Under these bias conditions, the cell 30 conducts a channel current only if in a programmed state, i.e., only if the floating gate 42 is charged. Thus, unlike conventional NMOS memory cells, the PMOS Flash memory cell 30 does not suffer from read disturb problems.

The PMOS flash cell 30 is advantageous in numerous ways over conventional NMOS memory cells. For a detailed discussion of such advantages, refer to the above-referenced Chang patent, incorporated herein by reference. Because PMOS Flash memory cells require different bias conditions during programming, erasing, and reading operations, conventional array architectures designed for NMOS Flash memory cells are not always suitable for PMOS Flash EEPROM. Accordingly, there exists a need for an array architecture which optimizes the performance of PMOS Flash memory cells.

SUMMARY

A novel array architecture is disclosed which allows for isolation of a page of memory cells during erasing operations. In accordance with the present invention, a memory array includes a predetermined number of rows of PMOS Flash memory cells formed in each of a plurality of n– well regions of a semiconductor substrate, where each of the n– well regions defines a page of the memory array. In some embodiments, a plurality of bit lines define columns of the memory array, where the p+ drain of each of the memory cells in a common column are coupled to an associated one of the bit lines. In other embodiments, a plurality of sub-bit lines define columns of the memory array, where the p+ drain of each of the memory cells in a common column are coupled to an associated one of the sub-bit lines, and groups of a predetermined number of the sub-bit lines are selectively coupled to associated ones of a plurality of bit lines via pass transistors. During erasing operations, a selected n– well region, within which are formed the memory cells of a selected page, is held at a first voltage, while the other n– well regions, within which are formed the memory cells of the respective un-selected pages, are held at a second voltage. The first and second voltages are different, thereby isolating the un-selected pages from erasing operations of the selected page.

Like components in the Figures are similarly labeled.

DETAILED DESCRIPTION

Figure 1:
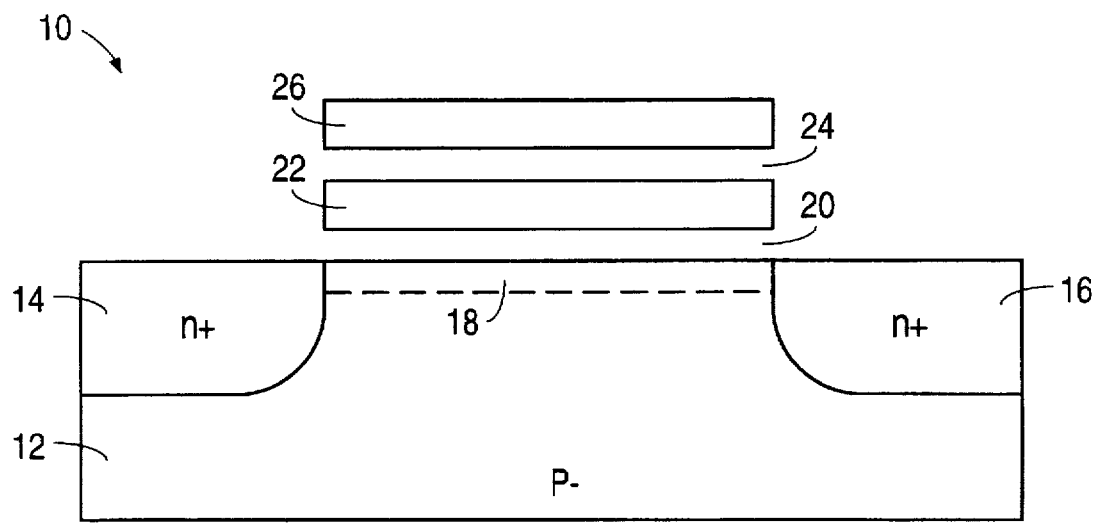
FIG. 1 is a schematic diagram of a NMOS Flash memory cell.
Figure 2:
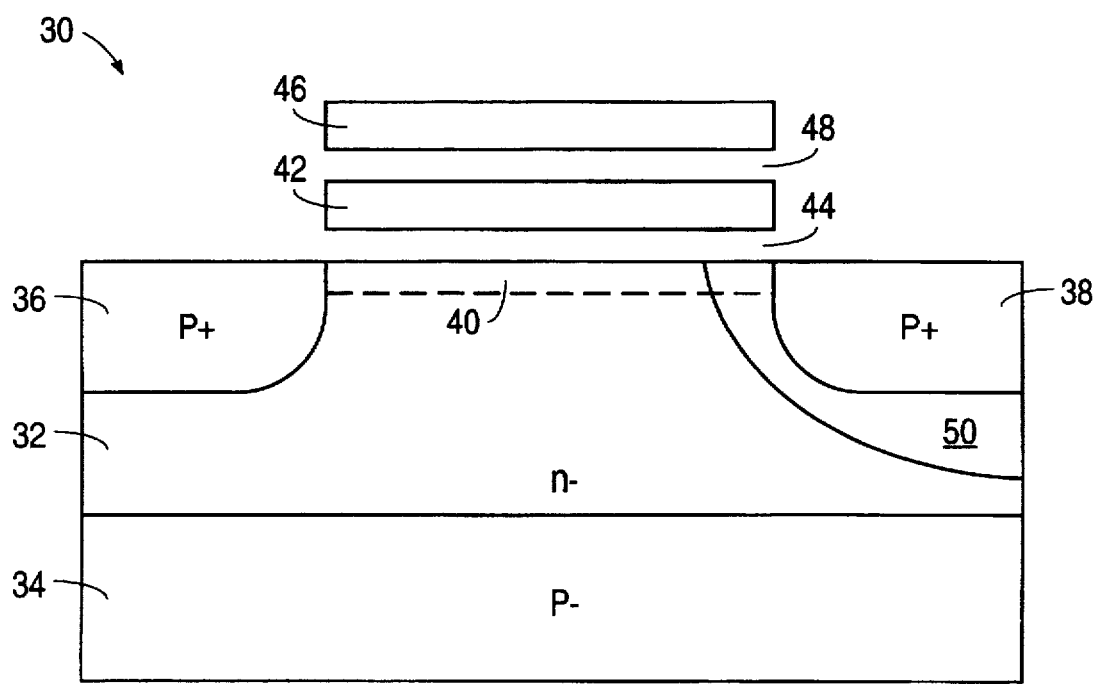
FIG. 2 is a schematic diagram of a PMOS Flash memory cell.

Embodiments of the present invention are discussed below in the context of a memory array 60 housing a plurality of PMOS Flash memory cells 30 (see FIG. 2) for simplicity only. It is to be understood that array architectures in accordance with the present invention may be configured differently, as dictated by specific application needs, and that arrays in accordance with the present invention may employ memory cells other than the cell 30.

Array 60 is shown to include thirty-two of the cells 30 arranged in 8 rows by 4 columns, where each of the columns is segmented into 2 pages 62a and 62b, for simplicity. In actual embodiments, array 60 may be configured to have a greater or fewer number of columns and/or rows, and the size of each page 62, e.g., the number of columns and/or rows within each page 62, may vary, depending upon silicon size and other desired parameters. Each of the pages 62 is defined by, and thereby corresponds to, an n– well region formed within the substrate upon which the array 60 is fabricated. Un-selected pages are isolated from selected pages during operations such as, for instance, an erasing of selected memory cells, by holding the n– well region within which are formed the cells of the selected page at a different potential than the n– well regions within which are formed the cells of the respective un-selected pages. In this manner, pages which are not selected for erasing are not affected by the erasing of a selected one or more of the pages 62.

Figure 3:
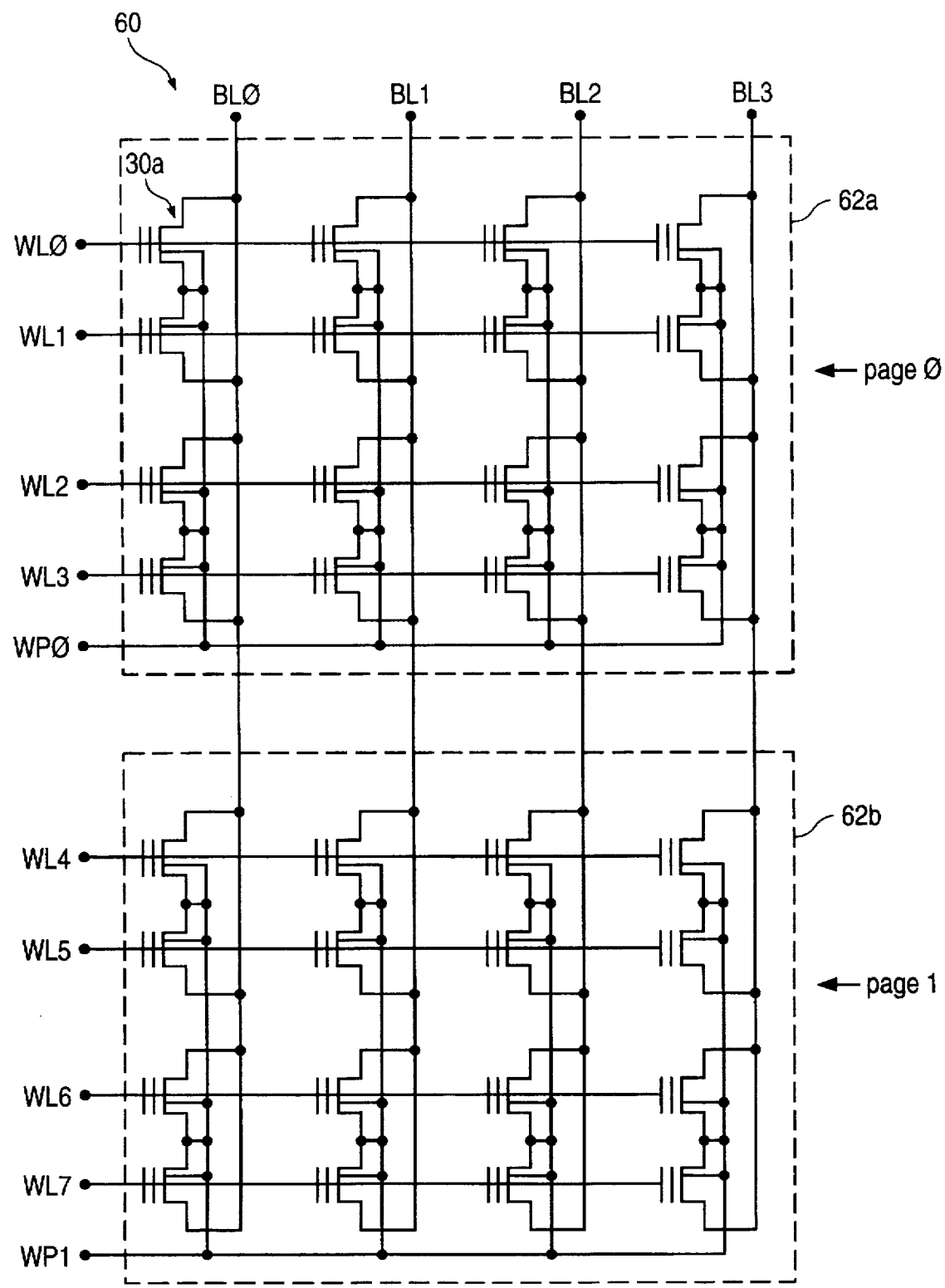
FIG. 3 is a schematic diagram of an array architecture in accordance with one embodiment of the present invention.

Referring now to FIG. 3, the cells 30 within each page 62 of the array 60 are formed in a common n– well 32. Thus, in actual embodiments, each page 62 of the array 60 corresponds to a distinct n– well region 32. As explained in detail below, pages may be selectively erased by isolating the potentials of the various n– well regions within the array 60.

The control gates 46 of the cells 30 in a common row of the array 60 are coupled to an associated one of the word lines WL. The p+ drains 38 of the cells 30 in a common column are coupled to an associated one of the bit lines BL. The p+ sources 36 of the cells 30 within each page 62 are commonly coupled. In the embodiment shown in FIG. 3, the common sources of the cells 30 within a page and the n– well region 32 associated with that page 62 are coupled to an associated one of the well potential lines WP. In other embodiments, the common sources may instead to coupled to a separate source terminal, thereby allowing the common sources of cells within a page and the well associated with that page to be held at different potentials.

To program a selected cell within the page 0 such as, for instance, the cell 30a, the page 0 is isolated by applying approximately 6.0 volts to the well potential line WP0 and applying a voltage equal to or slightly greater than 6.0 volts to the well potential line WP1. Thus, the p+ sources 36 of all the cells 30 within the page 0, as well as the n– well region 32 within which these cells 30 are formed, are at a potential of approximately 6.0 volts, and the p+ sources 36 of all the cells within the un-selected page 1, as well as the n– well region 32 within which these cells are formed, are at a slightly greater potential. The selected bit line BL0 is held at approximately ground potential, while all un-selected bit lines, i.e., BL1–BL3, are at a floating potential. A ramped programming voltage $V_p$ is applied to the selected word line WL0, while the un-selected word lines, i.e., WL1–WL7, are held at a high positive voltage of, for instance, approximately 8.5 volts. The ramped programming voltage $V_p$ applied to the selected word line WL0 causes holes to accelerate across the channel 40 of cell 30a and, as explained above, results in the injection of hot electrons into the floating gate 42 of cell 30a, thereby programming the cell 30a.

In a preferred embodiment, the programming voltage $V_p$ is ramped from approximately ground potential to approximately 4 volts. A detailed description of various techniques for programming a PMOS Flash EEPROM cell such as, for instance, the cell 30, is disclosed in commonly owned U.S. patent application Ser. No. 08/727,875 entitled "Programming Pulse Ramp Control Circuit", filed on Oct. 9, 1996, and issued to Kowshik as U.S. Pat. No. 5,687,116.

The un-selected cells 30 within the same row as cell 30a, i.e., those cells coupled to the selected word line WL0, are not programmed since the p+ drains of each of these un-selected cells 30 are floating. The un-selected cells 30 within the page 0 that are coupled to the selected bit line BL0 are not programmed because the respective control gates of these un-selected cells 30 are held at a constant high positive potential, e.g., 8.5 volts, via the un-selected word lines WL1–WL3. The absence of the ramped programming voltage $V_p$ on the control gates of the cells 30 of page 1 precludes programming of the cells 30 within the un-selected page 0. Thus, only the cell 30a in the selected page 0 is programmed.

To read the selected cell 30a, the voltage on the bit line BL0 is set to approximately ground potential, while the un-selected bit lines, e.g., bit lines BL1–BL3, are floating. The voltage on the selected word line WL0 is set to approximately ground potential, while the voltage on the un-selected word lines WL1–WL7 is set to approximately 3 volts. The n– well region 32 of the selected page 0, and thus the p+ sources 38 of the cells 30 within the selected page 0, are set to approximately 3 volts via the well potential line WP0. The well potential line WP1 is held at approximately 3 volts. Thus, the selected cell 30a will conduct a channel current if in a programmed state.

The cells 30 residing within the un-selected pages, e.g., page 1, are isolated from the reading operations within the selected page. The positive voltage on the un-selected word lines WL1–WL7 prevents those cells 30 coupled thereto from conducting a channel current, while floating the bit lines BL1–BL3 prevents the cells 30 coupled thereto from conducting a channel current.

To erase the cells within page 0, a high positive voltage such as, for instance, approximately 8.5 volts, is applied to the well potential line WP0, while the n– well regions associated with un-selected pages, e.g., the well potential line WP1, are floating. A high negative voltage such as, for instance, approximately –8.5 volts, is applied to the word lines WL0–WL3 of the selected page 0, while a low positive voltage such as, for instance, approximately 3 volts, is applied to the word lines WL4–WL7 of the un-selected page 1. All the bit lines BL of the array are floating during erasing operations.

The erase bias voltages applied to each of the cells 30 within the selected page 0 causes electrons within the floating gates 42 of these cells to tunnel into the respective p+ sources 36 of these cells, as well as to the n– well region 32 of the page 0, thereby erasing all the cells 30 in the selected page 0 via channel erasing. Since the n– well region within which are formed the cells 30 of the un-selected page 1 are floating, electrons within the respective floating gates 42 of these cells 30 do not tunnel into the n– well region of the un-selected page 1. Thus, the un-selected pages of the array 60 are isolated from the erasing operations of the selected page of the array 60 by floating the n– well regions which define the un-selected pages of the array 60.

Further, forming the memory cells of each page within a separate n– well region, as described above, has the advantage of increasing programming speeds of the memory cells. During programming of a cell within a selected page of present embodiments, only the n– well region associated with the selected page needs to be charged to a suitable potential for programming, e.g., approximately 6.5 volts. In contrast, in those array architectures in which all of the memory cells of the memory array are formed in a single well or substrate, the entire well or substrate must be charged to a voltage suitable for programming. The capacitance of an n– well region of an array architecture in accordance with the present invention is much less than the capacitance of the entire substrate, thereby allowing the n– well region to be charged at a faster rate than the substrate. Accordingly, programming speeds are improved.

The range of voltages employed to program and read cell 30a of the page 0 of the array 60 are listed below in Tables 1, and 2, respectively, while the range of voltages employed to erase the cells within the selected page 0 are listed below in Table 3.

TABLE 1

Programming voltages

| Node | Voltage Range (volts) |
| --- | --- |
| well region and sources of cells of the selected page, i.e., page 0 | 5.0 to 8.5 |
| well region and sources of cells of un-selected page, i.e, page 1 | 2.0 to 8.5 |

TABLE 1-continued

Programming voltages

| Node | Voltage Range (volts) |
| --- | --- |
| selected bit line, i.e., BL0 | 0 |
| un-selected bit lines, i.e., BL1–BL3 | float |
| selected word line, i.e., WL0 | ramped voltage ($V_p$) |
| other word lines within the selected page, i.e, | 6.0 to 10.5 |
| word lines within un-selected page, i.e., WL4–WL7 | 2.0 to 8.5 |

TABLE 2

Read voltages

| Node | Voltage Range (volts) |
| --- | --- |
| well region and sources of cells of the selected page, i.e., page 0 | 2.0 to 8.5 |
| well region and sources of cells of un-selected pages, i.e, page 1 | 2.0 to 8.5 |
| selected bit line, i.e., BL0 | 0 |
| un-selected bit lines, i.e., BL1–BL3 | float |
| selected word line, i.e., WL0 | 0 |
| other word lines within the selected page, i.e, | 2.0 to 8.5 |
| word lines within un-selected page, i.e., WL4–WL7 | 2.0 to 8.5 |

TABLE 3

Erase voltages

| Node | Voltage Range (volts) |
| --- | --- |
| well region and sources of cells of the selected page, i.e., page 0 | 6.0 to 10.5 |
| well region and sources of cells of un-selected pages, i.e, page 1 | float |
| selected bit line, i.e., BL0 | float |
| un-selected bit lines, i.e., BL1–BL3 | float |
| selected word line, i.e., WL0 | –6.0 to –11.0 |
| other word lines within the selected page, i.e, | –6.0 to –11.0 |
| word lines within un-selected page, i.e., WL4–WL7 | 2.0 to 8.5 |

In other embodiments of the present invention, read speed may be increased by making modifications to the array 60. For instance, when erasing the cells of a selected page of the array 60, the respective n– well regions of the un-selected pages are at a floating potential in order to isolate the un-selected pages from the erasing operation. However, during reading operations, the n– well region of the selected page is held at approximately 3 volts. Thus, when it is desired to read the cells 30 of a page which was previously un-selected during an erasing operation, the n– well region which defines that page must be brought to approximately 3 volts. The time required to bring an n– well region of the array 60 from a floating potential to approximately 3 volts undesirably slows the read speed of the array 60. Applicants have found that although holding the n– well region of an un-selected page at the read voltage of approximately 3 volts during erasing operations, as compared to the 8.5 volts applied to the n− well region of the selected page, provides a sufficient voltage differential to isolate the un-selected page from the erasing operations of the selected page, the high voltage on the n− well region of the selected pages may undesirably couple to the n− well region of the un-selected pages via the bit lines BL.

Figure 4:
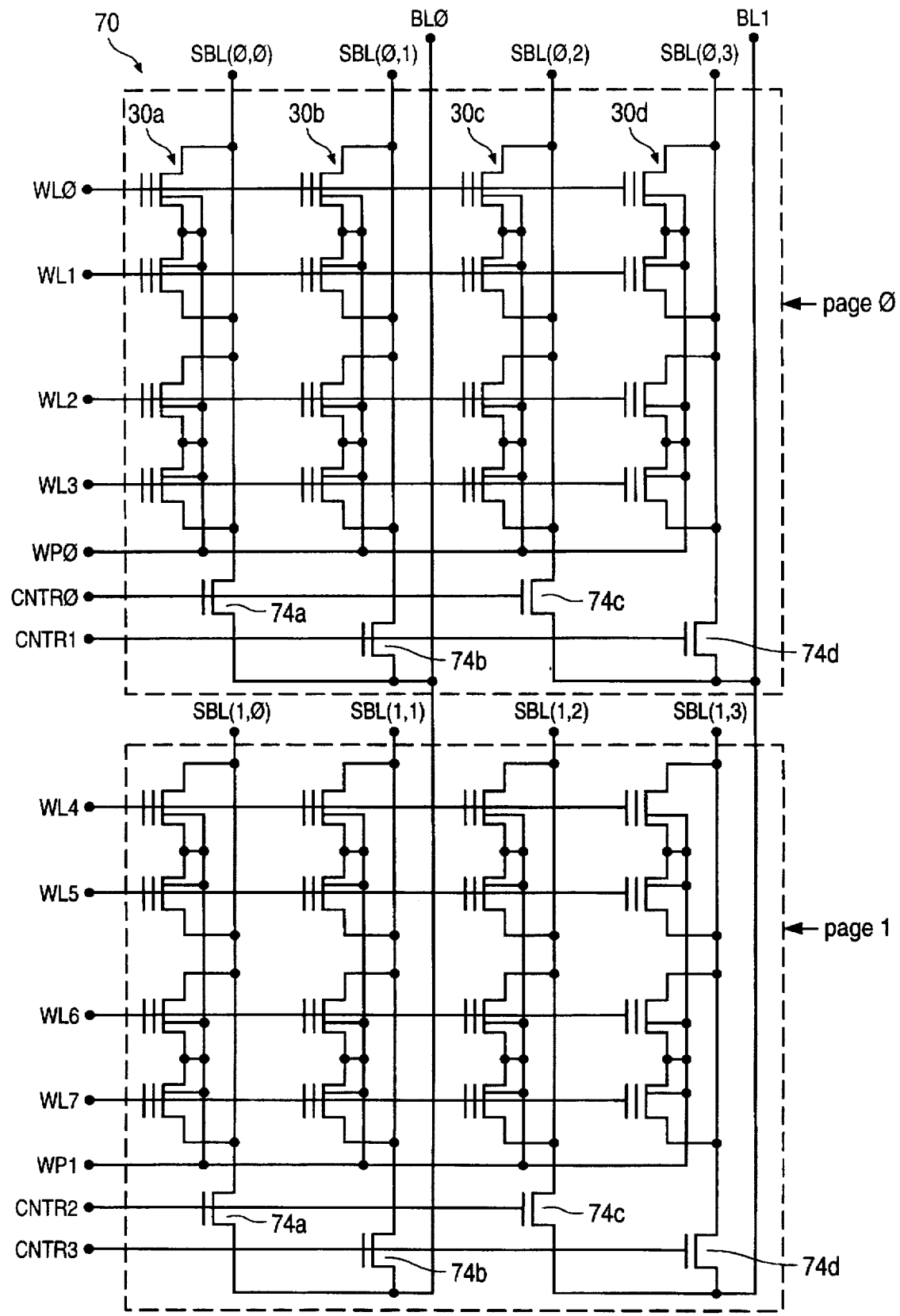
FIG. 4 is a schematic diagram of an array architecture in accordance with another embodiment of the present invention.

Thus, in another embodiment of the present invention, the p+ drains 38 of the cells 30 in a common column of each page are coupled to a sub-bit line SBL, as illustrated by the array 70 shown in FIG. 4, and pairs of the sub-bit lines SBL are coupled to an associated bit line BL via pass transistors 74. The gates of pass transistors 74 are coupled to control lines CNTR as shown in FIG. 4. In other embodiments, more than two sub-bit lines SBL may be coupled to each of the bit lines BL via the pass transistors 74.

Taking, for instance, the page 0 of the array 70, the cells 30 of the page 0 which reside in the same column as the cell 30a are coupled to the sub-bit line SBL(0,0), where the (0,0) denotes page 0 and sub-bit line 0, and the cells 30 of the page 0 which reside in the same column as the cell 30b are coupled to the sub-bit line SBL(0,1), where the (0,1) denotes page 0 and sub-bit line 1. Sub-bit lines SBL(0,0) and SBL(0,1) are coupled to the bit line BL0 via NMOS pass transistors 74a and 74b, respectively. Control line CNTR0 is coupled to the gates of pass transistors 74a and 74c, while control line CNTR1 is coupled to the gates of pass transistors 74b and 74d. Note that in other embodiments in which pages 62 include more than four columns of the cells 30, each control line CNTR may be coupled to a greater number of the pass transistors 74.

When accessing one of the cells 30 for a particular operation, the pass transistor 74 associated with that cell is turned on by applying a high positive voltage to the appropriate one of the control lines CNTR. The remaining control lines CNTR are grounded. Note that in other embodiments where PMOS devices are employed as the pass transistors 74, the bias voltages applied to the gates of the pass transistors are reversed, i.e., a high positive voltage on control a line CNTR will turn off the pass transistors associated therewith, while a low positive voltage, i.e., ground potential, will turn on the pass transistors associated therewith. To access, for instance, the cell 30a, a high positive voltage such as, for instance, 5 volts is applied to control line CNTR0, thereby turning on pass transistors 74a and 74c, while all other control lines CNTR1-3 are grounded. Thus, with the sub-bit line SBL(0,0) coupled to the bit line BL0, cell 30a may be programmed or read in the manner described above with respect to the array 60 (FIG. 3).

The voltages used in programming and reading, for instance, the cell 30a of the array 70 are identical to those provided above with respect to the array 60, e.g., see Tables 1 and 2, respectively.

The inclusion of the sub-bit lines SBL and the pass transistors 74 within the array 70 improves the isolation of the potential of the various n− well regions of the array 70 by minimizing an undesirable coupling between the various n− well regions. Thus, instead of coupling the n− well regions of pages 62 not selected for erasing to a floating potential, these "un-selected" n− well regions may be held at a finite voltage while still isolating the cells within these n− well region from the erasing of cells within selected page(s) 62. Accordingly, when erasing the cells of the page 0 of the array 70, well potential line WP0 is held at approximately 8.5 volts, while the well potential line WP1 is held at approximately 3 volts. Thus, the selected n− well region is at approximately 8.5 volts, while the un-selected well regions are at approximately 3 volts. All bit lines BL are held at a floating potential, all word lines within the selected page 0, e.g., WL0–WL3, are held at approximately −8.5 volts, and all word lines within the un-selected page 1, e.g., WL4–WL7 are held at approximately 3 volts. The voltage differential between the n− well region of the selected page 0 and the n− well region of the un-selected page 1 isolates the cells within the un-selected page 1 from the erasing of the cells of the selected page 0. Further, since the n− well region of the un-selected page 1 is at approximately 3 volts, as opposed to a floating potential, as was necessary in the embodiment of FIG. 3 due to coupling between the various n− well regions, a subsequent reading of the cells 30 of page 1 does not require its associated n− well region to be charged to approximately 3 volts. Thus, even when an n− well region is un-selected during an erasing operation, the n− well region is in a "read-ready" state. Accordingly, read speeds are improved over the embodiment of FIG. 3. Voltage ranges suitable for erasing the cells of the page 0 of the array 70 are listed below in Table 4.

TABLE 4

Erase voltages

| Node | Voltage Range (volts) |
| --- | --- |
| well region and sources of cells of the selected page, i.e., page 0 | 6.0 to 10.5 |
| well region and sources of cells of un-selected pages, i.e., page 1 | 2.0 to 8.5 |
| selected bit line, i.e., BL0 | float |
| un-selected bit lines, i.e., BL1–BL3 | float |
| selected word line, i.e., WL0 | −6.0 to −11.0 |
| other word lines within the selected page, i.e., | −6.0 to −11.0 |
| word lines within un-selected page, i.e., WL4–WL7 | 2.0 to 8.5 |

The inclusion of the sub-bit lines SBL and the pass transistors 74 within the array 70 reduces the capacitance of the bit lines BL, which further improves the speed with which the cells 30 of the array are read. For instance, where it is desired to have a 4M memory array configured as a 2k by 2k matrix, the capacitance of each of the bit lines BL in the array 60 is approximately equal to 2.1 pF, and the capacitance of each of the bit lines BL in the array 70 is less than approximately 0.4 pF. Note, however, that the inclusion of the sub-bit lines SBL and the associated pass transistors 74 increases the silicon die area of a memory. Thus, where minimizing the die size of memory is critical, the array architecture of FIG. 3 is more suitable, and where maximizing the speed with which memory cells are accessed is critical, the array architecture of FIG. 4 is more suitable.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A memory array comprising a plurality of pages, where each of said pages comprises:

an n– well region;

a plurality of word lines defining rows of said page; and a plurality of PMOS Flash EEPROM memory cells formed in said n– well region, each of said memory cells comprising a p+ source, a p+ drain, a floating gate, and a control gate, said p+ sources of said memory cells electrically coupled to said n– well region and said control gates of said memory cells in a common row of said page coupled to an associated one of said word lines, wherein upon selection of a page during erasing operations a selected one of said n– well regions, within which are formed the memory cells of said selected page, is held at a first potential, while the other n– well regions, within which are formed the respective memory cells of the un-selected pages, is held at a second potential, said first potential, being different from said second potential, such that said un-selected pages are unaffected by said erasing operations of said selected page.

2. The memory array of claim 1, wherein said first potential is between approximately 7 and 10.5 volts and said second potential is a floating potential.

3. The memory array of claim 1, further comprising a plurality of bit lines defining columns of said array, wherein said p+ drains of said memory cells in a common column are coupled to an associated one of said bit lines.

4. The memory array of claim 3, wherein a selected one of said memory cells within a selected one of said pages is programmed by applying a ramped program voltage to a selected one of said word lines while applying between approximately 7 and 10.5 volts to un-selected word lines within said selected page and applying between approximately 2 and 8.5 volts to said word lines of un-selected ones of said pages.

5. The memory array of claim 4, wherein a selected one of said bit lines is grounded and un-selected ones of said bit lines are held at a floating potential.

6. The memory array of claim 3, wherein a selected one of said memory cells within a selected one of said pages is erased by applying between approximately 7 and 10.5 volts to a selected n– well region associated with said selected page and applying between approximately 2 and 8.5 volts to un-selected n– well regions associated with un-selected ones of said pages.

7. The memory array of claim 6, wherein said bit lines are held at a floating potential.

8. The memory array of claim 6, wherein said word lines within said selected page are held at a high negative voltage.

9. The memory array of claim 8, wherein said high negative voltage is between approximately –6 and –11 volts.

10. The memory array of claim 6, wherein said word lines within un-selected ones of said pages are held at between approximately 2 and 8.5 volts.

11. The memory array of claim 3, wherein a selected one of said memory cells within a selected one of said pages is read by grounding a selected one of said word lines and applying between approximately 2 and 8.5 volts to un-selected ones of said word lines.

12. The memory array of claim 11, wherein a selected one of said bit lines is grounded and remaining ones of said bit lines are floating.

13. The memory array of claim 11, wherein said n– well regions are held at between approximately 2 and 8.5 volts.

14. The memory array of claim 1, further comprising:

a plurality of sub-bit lines defining columns of said memory array, wherein said p+ drains of said memory cells within a common one of said columns are coupled to an associated one of said sub-bit lines;

a plurality of bit lines, wherein each of said bit lines is selectively coupled to a predetermined number of said sub-lines via associated pass transistors, each of said pass transistors having a gate; and a plurality of control lines, each of said control lines being coupled to the gates of associated ones of said pass transistors.

15. The memory array of claim 1, wherein said first potential is between approximately 7 and 10.5 volts and said second potential is between approximately 2 and 8.5 volts.

16. The memory array of claim 14, wherein a selected one of said memory cells within a selected one of said pages is programmed by applying a ramped program voltage to a selected one of said word lines while applying between approximately 7 and 10.5 volts to un-selected word lines within said selected page and applying between approximately 2 and 8.5 volts to said word lines of un-selected ones of said pages.

17. The memory array of claim 16, wherein a selected one of said bit lines is grounded and un-selected ones of said bit lines are held at a floating potential.

18. The memory array of claim 17, wherein said bit lines are held at a floating potential.

19. The memory array of claim 17, wherein said word lines within said selected page are held at a high negative voltage.

20. The memory array of claim 19, wherein said high negative voltage is between approximately –6 and –11 volts.

21. The memory array of claim 17, wherein said word lines within un-selected ones of said pages are held at between approximately 2 and 8.5 volts.

22. The memory array of claim 14, wherein a selected one of said memory cells within a selected one of said pages is read by grounding a selected one of said word lines and applying between approximately 2 and 8.5 volts to un-selected ones of said word lines.

23. The memory array of claim 22, wherein a selected one of said bit lines is grounded and remaining ones of said bit lines are floating.

24. The memory array of claim 22, wherein said n– well regions are held at between approximately 2 and 8.5 volts.

* * * * *